(12) United States Patent
Harada et al.

(10) Patent No.: US 11,263,983 B2
(45) Date of Patent: Mar. 1, 2022

(54) DISPLAY DEVICE AND DISPLAY METHOD THAT DISPLAYS AN IMAGE BY DECREASING AND INCREASING PIXEL LUMINANCE

(71) Applicant: Japan Display Inc., Tokyo (JP)

(72) Inventors: Tsutomu Harada, Tokyo (JP); Kazunari Tomizawa, Tokyo (JP); Kazunori Yamaguchi, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/181,276

(22) Filed: Feb. 22, 2021

(65) Prior Publication Data
US 2021/0174753 A1  Jun. 10, 2021

Related U.S. Application Data

(63) Continuation of application No. PCT/JP2019/031705, filed on Aug. 9, 2019.

(30) Foreign Application Priority Data

Aug. 22, 2018  (JP) .............................. JP2018-155613

(51) Int. Cl.
*G09G 3/34* (2006.01)
*H01L 27/32* (2006.01)

(52) U.S. Cl.
CPC ....... *G09G 3/3413* (2013.01); *H01L 27/3218* (2013.01); *G09G 2300/0452* (2013.01); *G09G 2320/0233* (2013.01)

(58) Field of Classification Search
CPC ... H01L 51/50; H01L 27/3218; G09G 3/3413; G09G 3/20; G09G 3/3225; G09G 2320/0233; G09G 2300/0452
See application file for complete search history.

(56) References Cited

U.S. PATENT DOCUMENTS

| 10,573,253 B2 * | 2/2020 | Sako ..................... G09G 3/3426 |
| 2009/0051627 A1 | 2/2009 | Inhata et al. |
| 2016/0117973 A1 * | 4/2016 | Lee ....................... G09G 3/3275 345/691 |

FOREIGN PATENT DOCUMENTS

| JP | 2003-263131 A | 9/2003 |
| JP | 2009-75563 A | 4/2009 |
| WO | 2018/223643 A1 | 12/2018 |

OTHER PUBLICATIONS

International Search Report and Written Opinion dated Nov. 5, 2019, received for PCT Application PCT/JP2019/031705 Filed on Aug. 9, 2019, 10 pages including English Translation.

* cited by examiner

*Primary Examiner* — Kwang-Su Yang
(74) *Attorney, Agent, or Firm* — Xsensus LLP

(57) ABSTRACT

According to one embodiment, a display device includes a display panel on which a plurality of pixels having a light emitting element is disposed and a display control unit configured to display an image on the display panel by causing each of the plurality of pixels to emit light based on a pixel signal that defines luminance of each of the plurality of pixels. The display control unit is configured to display the image by decreasing luminance of a first pixel which is a protection target pixel of the plurality of pixels and increasing luminance of a second pixel disposed around the first pixel.

20 Claims, 9 Drawing Sheets

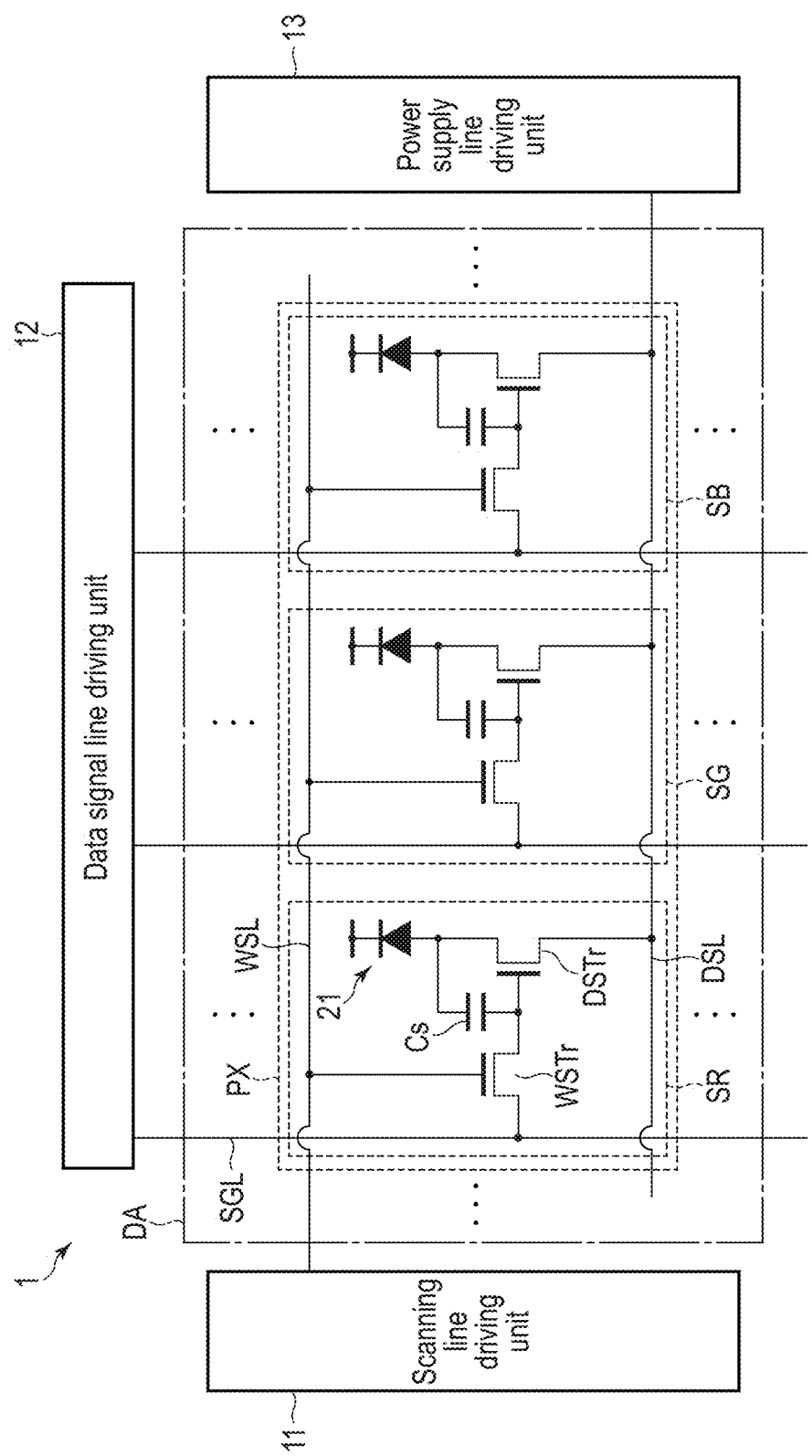
F I G. 2

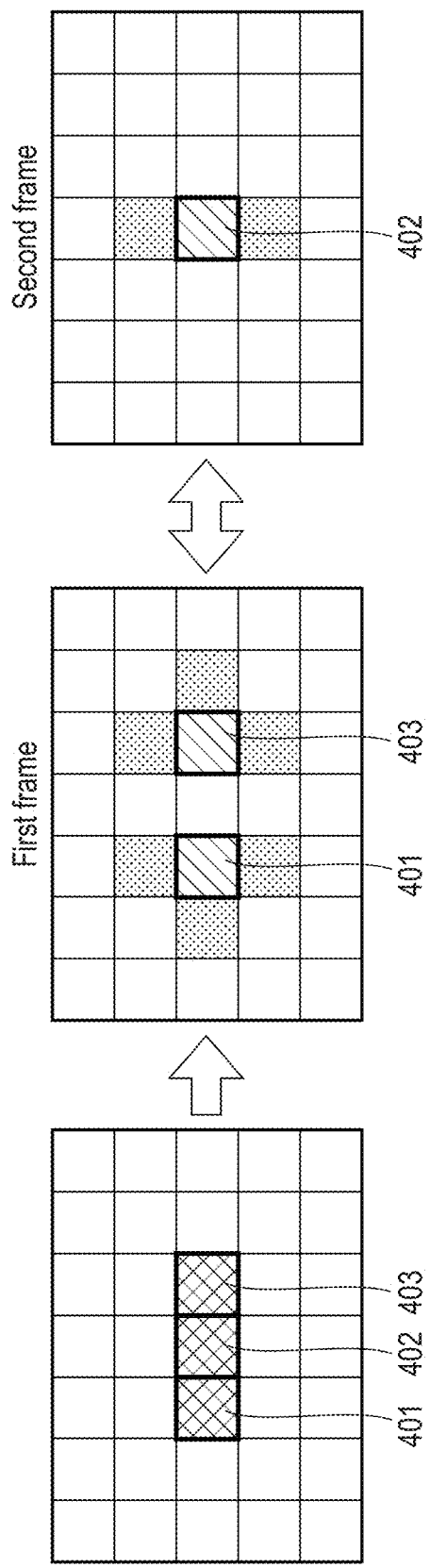
F I G. 12

DISPLAY DEVICE AND DISPLAY METHOD THAT DISPLAYS AN IMAGE BY DECREASING AND INCREASING PIXEL LUMINANCE

CROSS-REFERENCE TO RELATED APPLICATIONS

This application is a Continuation Application of PCT Application No. PCT/JP2019/031705, filed Aug. 9, 2019 and based upon and claiming the benefit of priority from Japanese Patent Application No. 2018-155613, filed Aug. 22, 2018, the entire contents of all of which are incorporated herein by reference.

FIELD

Embodiments described herein relate generally to a display device and a display method.

BACKGROUND

In recent years, for example, a display device (hereinafter, referred to as an organic EL display) having an organic electroluminescence (EL) element is adopted to an electronic device such as a smartphone.

When the organic EL display is adopted, there is an advantage that the electronic device can be made thinner and lighter and the power consumption can be reduced compared with, for example, a liquid crystal display.

Here, a plurality of pixels are disposed in the organic EL display, and a light emitting element (an organic EL element) of each of the pixels emits light by itself so that an image is displayed on the display. Therefore, for example, when the same image is displayed for a long time, a burden may be concentrated on a specific pixel (a light emitting element) that continuously emits light with high luminance.

It is known that when the burden is concentrated on the specific pixel in this way, deterioration of the pixel progresses more than that of other pixels, and a phenomenon referred to as persistence occurs.

On the other hand, for example, by shifting an entire image (a screen) displayed on the organic EL display, measures may be taken to prevent the burden from being concentrated on the specific pixel.

However, in the measures, discomfort (displeasure) may be given to a user who visually recognizes the image, and, for example, an effect cannot be obtained when an image having a uniform color is displayed.

BRIEF DESCRIPTION OF THE DRAWINGS

FIG. 2 is a diagram illustrating an example of a circuit configuration of the display device.

FIG. 12 is a diagram for explaining a case where a plurality of protection target pixels is consecutively disposed.

DETAILED DESCRIPTION

In general, according to one embodiment, a display device includes a display panel on which a plurality of pixels having a light emitting element is disposed and a display control unit configured to display an image on the display panel by causing each of the plurality of pixels to emit light based on a pixel signal that defines luminance of each of the plurality of pixels. The display control unit is configured to display the image by decreasing luminance of a first pixel which is a protection target pixel of the plurality of pixels and increasing luminance of a second pixel disposed around the first pixel.

Various embodiments will be explained hereinafter with reference to the accompanying drawings. Note that the disclosure is merely an example, and any embodiment which is conceivable by a person having an ordinary skill in the art within the spirit of the invention is encompassed by a range of the present invention. Furthermore, for better understanding of the explanation, figures may be drawn more schematically as compared to an actual embodiment, and they are merely for clarification. Such schematic illustration does not limit the interpretation of the present invention. In each figure, some of same or similar elements arranged continuously may not be denoted, and the reference numbers may be omitted. Furthermore, in the description and each figure, structural elements which are functionally the same or similar to those have been explained already will be referred to by the same reference numbers and the explanation considered to be redundant will be omitted.

Figure 1:
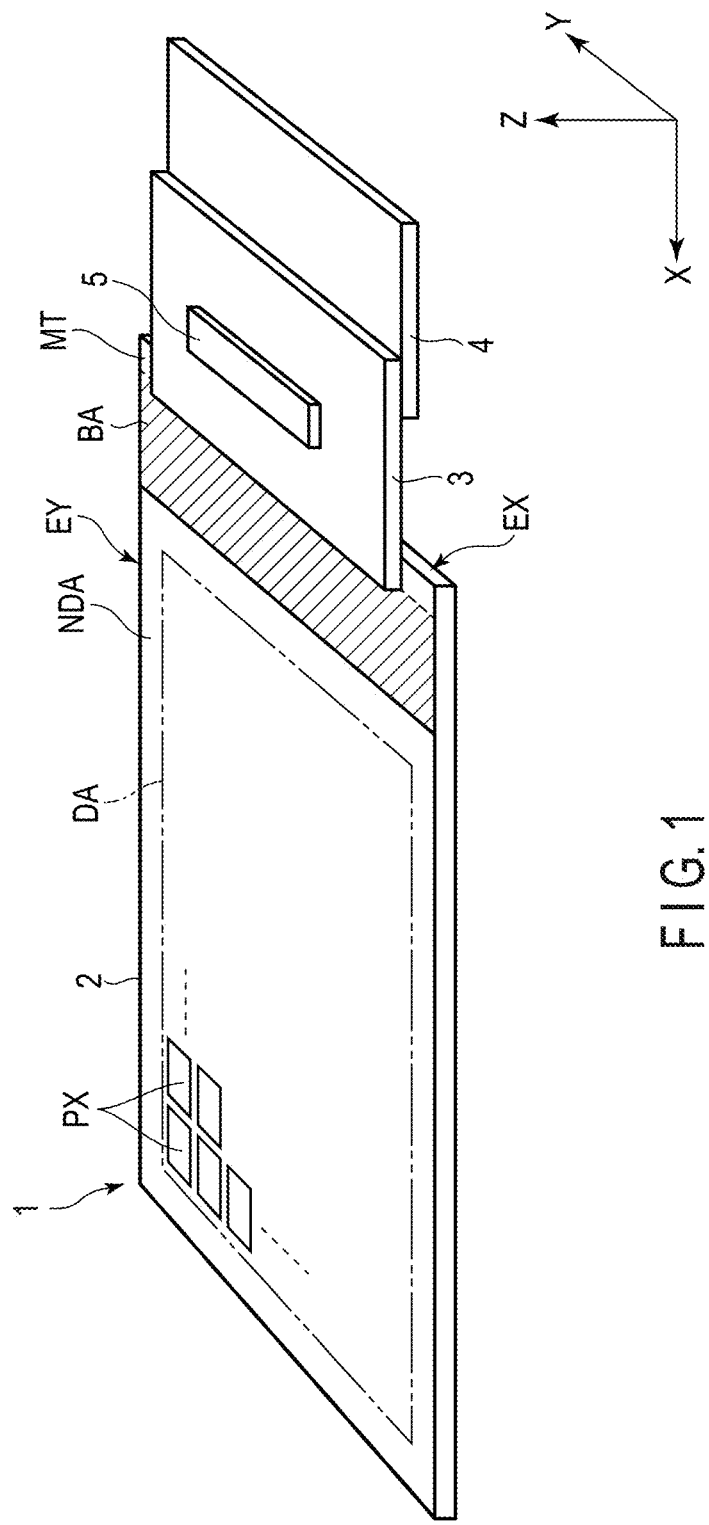
FIG. 1 is a perspective view schematically illustrating an example of a configuration of a display device according to an embodiment.

FIG. 1 is a perspective view schematically illustrating a configuration of a display device 1 according to an embodiment. FIG. 1 shows a three-dimensional space defined by a first direction X, a second direction Y perpendicular to the first direction X, and a third direction Z perpendicular to the first direction X and the second direction Y. The first direction X and the second direction Y are orthogonal to each other, but may intersect each other at an angle other than 90°. In the present embodiment, the third direction Z is defined as an upper direction, and the direction opposite to the third direction Z is defined as a lower direction. In the case of "the second member on the first member", and "the second member below the first member", the second member may be in contact with the first member, and may be located away from the first member.

Hereinafter, in the present embodiment, a case where the display device 1 is an organic EL display device (an organic EL display) having an organic electroluminescence (EL) element which is a spontaneous light-emitting element will be mainly described.

As illustrated in FIG. 1, the display device 1 includes a display panel 2, a first circuit board 3, a second circuit board 4, and the like.

The display panel 2 has a rectangular shape in one example. In an example illustrated in the drawing, a short side EX of the display panel 2 is parallel to a first direction X, and a long side EY of the display panel 2 is parallel to a second direction Y. A third direction Z corresponds to a thickness direction of the display panel 2. A main surface of the display panel 2 is parallel to an X-Y plane defined by the first direction X and the second direction Y. The display panel 2 has a display area DA, a non-display area NDA outside the display area DA, and a terminal area MT. In the example illustrated in the drawing, the non-display area NDA surrounds the display area DA.

The display area DA is an area for displaying an image, and includes, for example, a plurality of pixels PX disposed in a matrix. The pixel PX includes an organic EL element, a switching element for driving the organic EL element, and the like, which will be described later.

The terminal area MT is provided along the short side EX of the display panel 2 and includes a terminal for electrically connecting the display panel 2 to an external device, or the like.

The first circuit board 3 is mounted on the terminal area MT and is electrically connected to the display panel 2. The first circuit board 3 is, for example, a flexible printed circuit board. The first circuit board 3 includes a driver IC chip 5 (hereinafter, referred to as a panel driver) for driving the display panel 2 and the like. In the example illustrated in the drawing, the panel driver 5 is disposed on the first circuit board 3, but may be disposed below the first circuit board 3. The second circuit board 4 is, for example, a flexible printed circuit board. The second circuit board 4 is connected to the first circuit board 3, for example, below the first circuit board 3.

Here, the panel driver 5 is connected to a control board (not shown), for example, via the second circuit board 4. The panel driver 5 executes a control for displaying an image on the display panel 2 by causing the organic EL element of the display panel 2 to emit light, for example, based on image data (a pixel signal) output from the control board.

The display panel 2 may have a bend area BA indicated by a diagonal line. The bend area BA is an area which is bent when the display device 1 is housed in a housing such as an electronic device. The bend area BA is located on the terminal area MT side of the non-display area NDA. In a state where the bend area BA is bent, the first circuit board 3 and the second circuit board 4 are disposed below the display panel 2 so as to face the display panel 2.

FIG. 2 is a diagram illustrating an example of a circuit configuration of the display device 1 shown in FIG. 1. In FIG. 2, the display device 1 includes a scanning line driving unit 11, a data signal line driving unit 12, and a power supply line driving unit 13.

Here, a plurality of pixels PX is disposed in a matrix in the display area DA. In FIG. 2, for convenience, only one of a plurality of the pixels PX is shown. The pixel PX includes, for example, three sub-pixels SR, SG, and SB. In the display area DA, a plurality of scanning lines WSL extending along a row direction of the plurality of pixels PX disposed in matrix, a plurality of power supply lines DSL extending in parallel with the plurality of scanning lines WSL, and a plurality of data signal lines SGL extending along a columnar direction of the plurality of pixels PX are further disposed. An end of the scanning line WSL is connected to the scanning line driving unit 11. An end of the data signal line SGL is connected to the data signal line driving unit 12. An end of the power supply line DSL is connected to the power supply line driving unit 13.

For example, in a point of intersection of the scanning line WSL and the data signal line SGL, a sub-pixel SR having a light emitting element that emits red light, a sub-pixel SG having a light emitting element that emits green light, and a sub-pixel SB having a light emitting element that emits blue light are disposed. The arrangement of these sub-pixels SR, SG, and SB can be changed appropriately. For example, the pixel PX may further include a sub-pixel having a light emitting element that emits white light in addition to the red light, the green light, and blue light. The pixel PX may be configured to include one sub-pixel.

The configuration of the sub-pixel SR will be described. The sub-pixel SR includes a selection transistor WSTr, a driving transistor DSTr, a capacitive element Cs, and a light emitting element 21.

The light emitting element 21 is an organic EL light emitting element including an organic EL layer disposed between an anode electrode and a cathode electrode.

A gate electrode of the selection transistor WSTr is connected to the scanning line WSL. For example, a source electrode of the selection transistor WSTr is connected to the data signal line SGL. For example, a drain electrode of the selection transistor WSTr is connected to a first electrode of the capacitive element Cs and the gate electrode of the driving transistor DSTr.

For example, the source electrode of the driving transistor DSTr is connected to a second electrode of the capacitive element Cs and the anode electrode of the light emitting element 21. For example, the drain electrode of the driving transistor DSTr is connected to the power supply line DSL.

When a selection signal is supplied to the scanning line WSL, the selection transistor WSTr supplies a data signal supplied from the data signal line SGL in synchronization with the selection signal to the gate electrode of the driving transistor DSTr. The capacitive element Cs holds a gate potential of the driving transistor DSTr. The driving transistor DSTr supplies a drain current based on the gate potential to the light emitting element 21. The light emitting element 21 emits light with luminance corresponding to the drain current.

Here, the sub-pixel SR is described, but since the other sub-pixels SG and SB have the same configuration, the description of the sub-pixels SG and SB will be omitted.

The display device 1 according to the present embodiment can display an image on the display panel 2 (the display area DA) by controlling the luminance (the light emission) of the light emitting element of each of the plurality of pixels PX described above.

Here, for example, in the display device 1 (the organic EL display device) in which the plurality of pixels PX having the organic EL element are disposed as described above, when the same image is displayed for a long time, a burden is concentrated on the specific pixel (the organic EL element), and a phenomenon referred to as persistence may occur.

Therefore, in the display device 1 according to the present embodiment, the pixel on which the burden is concentrated is set as a protection target pixel (hereinafter, referred to as a protection target pixel), and the burden of the protection target pixel is reduced by distributing the luminance of the protection target pixel when the image is displayed to a pixel disposed around the protection target pixel (simply referred to as a surrounding pixel).

In the present embodiment, the "luminance of the protection target pixel" corresponds to luminance of the light emitting element of the protection target pixel. The "distributing the luminance of the protection target pixel" means decreasing the luminance of the protection target pixel and increasing the luminance of other pixels in accordance with the decrease in the luminance of the protection target pixel.

Hereinafter, with reference to FIG. 3, a principle of distributing the luminance of the protection target pixel to surrounding pixels will be described in the present embodiment.

Figure 3:
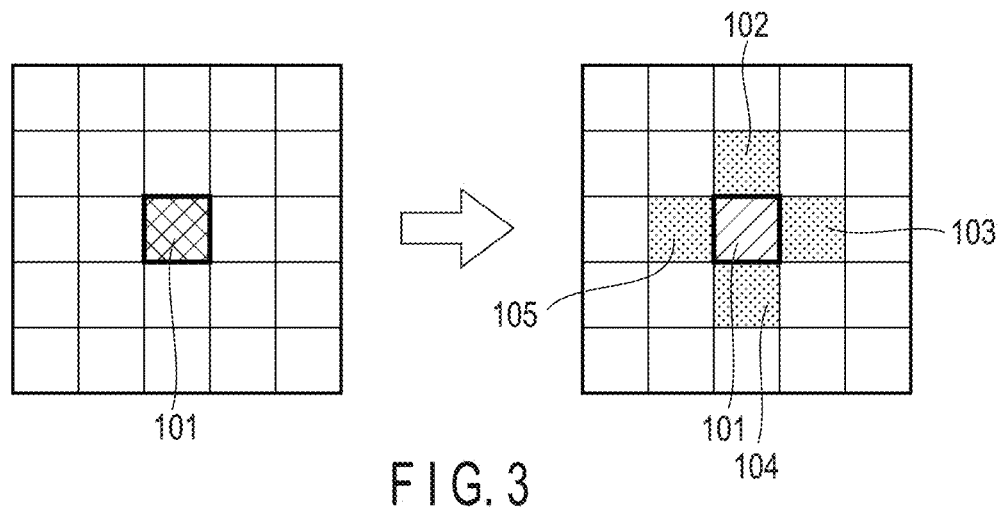
FIG. 3 is a diagram for explaining a principle or distributing luminance of a protection target pixel to surrounding pixels.

In FIG. 3, one block divided in a grid pattern represents one pixel. Here, a pixel 101 shown on a left side of FIG. 3 is the protection target pixel.

In this case, luminance of the pixel 101 is distributed to the surrounding pixels as shown on a right side of FIG. 3. In the example illustrated in FIG. 3, the luminance of the pixel 101 is distributed to a pixel 102 disposed on an upper side of the pixel 101, a pixel 103 disposed on a right side of the protection target pixel 101, a pixel 104 disposed on a lower side of the protection target pixel 101, and a pixel 105 disposed on left side of the protection target pixel 101.

Since the luminance of the pixel 101 can be decreased by distributing the luminance of the pixel 101 to the surrounding pixels 102 to 105 when the image is displayed based on the image data in this way, the burden of the pixel 101 can be reduced. In other words, in the present embodiment, the burden of the pixel 101 can be prevented from being concentrated by suppressing the light emission of the light emitting element of the pixel 101, and supplementing the suppressed light emission amount with the light emitting element of each of the surrounding pixels 102 to 105.

Figure 4:
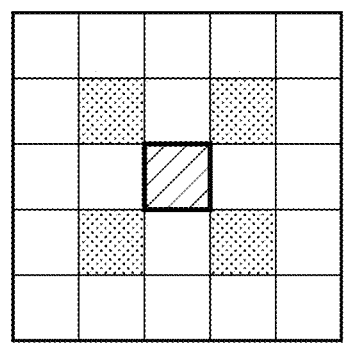
FIG. 4 is a diagram illustrating another example of an arrangement of the surrounding pixels to which the luminance is distributed.
Figure 5:
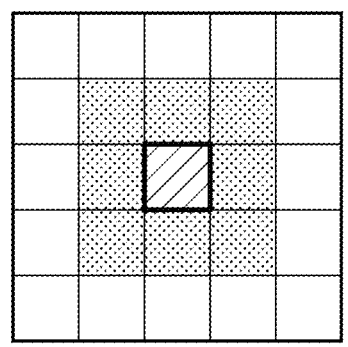
FIG. 5 is a diagram illustrating still another example of an arrangement of the surrounding pixels to which the luminance distributed.

The luminance of the pixel 101 is preferably distributed to the pixels disposed in a position where it is difficult to recognize deterioration of an image quality (a change in a color) when the luminance of the pixel 101 is distributed. In the example illustrated in FIG. 3, the luminance of the pixel 101 is distributed to the pixels 102 to 105 disposed (adjacent) in a vertical and horizontal directions of the pixel 101, but the luminance of the pixel 101 may be distributed to four pixels disposed in a diagonal direction of the pixel 101 as shown in FIG. 4, and may be distributed to eight pixels disposed so as to surround the pixel 101 as shown in FIG. 5. The luminance of the pixel 101 may be distributed to a plurality of pixels or may be distributed to one pixel. When a lot of luminance is distributed to one pixel, the change in a color becomes easy to visually recognize. Therefore, in such a case, it is preferable to distribute the luminance to a plurality of pixels.

Here, the distribution of the luminance in the present embodiment is executed in a unit of a sub-pixel. That is, in the present embodiment, the protection target pixel is, for example, one of the three sub-pixels SR, SG, and SB included in the pixel 101.

Specifically, when the sub-pixel SR included in the pixel 101 (that is, the sub-pixel having a light emitting element that emits red light) is the protection target pixel, the luminance of the protection target pixel is distributed to the sub-pixel SR included in each of the surrounding pixels 102 to 105 of the pixel 101. Similarly, when the sub-pixel SB included in the pixel 101 (that is, the sub-pixel having a light emitting element that emits blue light) is the protection target pixel, the luminance of the protection target pixel is distributed to the sub-pixel SB included in each of the surrounding pixels 102 to 105 of the pixel 101.

Here, when the luminance of all the colors (red, green, and blue) is simply distributed to the surrounding pixels, blurring occurs in the image after the luminance is distributed. Therefore, for example, when the sub-pixel SG included in the pixel 101 (that is, the sub-pixel having a light emitting element that emits green light) is the protection target pixel, a processing, which is different from the processing when the sub-pixel SR or SB described above is the protection target pixel, is executed.

A specific example in which the luminance of the sub-pixel when each of the sub-pixels SR, SG, and SB is the protection target pixel is distributed will be described below.

Figure 6:
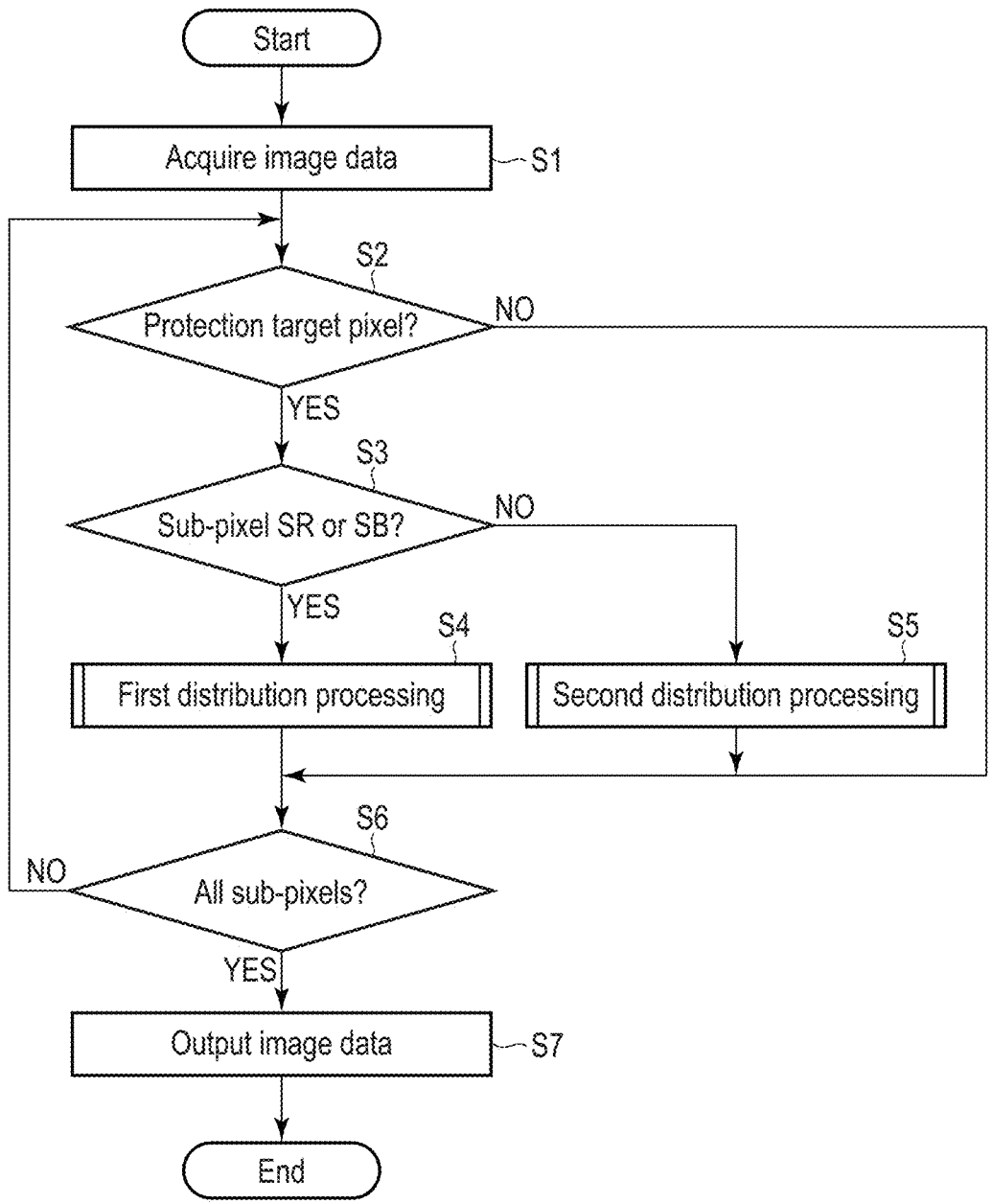
FIG. 6 is a flowchart illustrating an example of a processing procedure of the display device when an image is displayed on a display panel.

Next, a processing procedure of the display device 1 when an image is displayed on the display panel 2 will be described with reference to the flowchart of FIG. 6. The processing illustrated in FIG. 6 is executed by the panel driver 5 (a display control unit) described above.

When the image is displayed on the display panel 2, the panel driver 5 acquires image data from the control board as described above (Step S1). The image data includes a pixel signal that defines luminance of each of the sub-pixels included in the plurality of pixels PX disposed on the display panel 2. The panel driver 5 displays the image by causing each of the sub-pixels included in the plurality of pixels PX to emit light based on the pixel signal included in the image data. In addition, "causing the sub-pixel to emit light" means that the light emitting element of the sub-pixel emits light.

Next, the processing in Steps S2 to S5 below is executed for each of the sub-pixels included in the plurality of pixels PX disposed on the display panel 2. Hereinafter, the sub-pixel to be processed in Steps S2 to S5 is referred to as a target pixel.

Here, the panel driver 5 manages art accumulated light emission (lighting) time for each of the sub-pixels included in the plurality of pixels PX disposed on the display panel 2. This accumulated light emission time is an accumulated value of a light emission time of the light emitting element of each sub-pixel. The accumulated lighting time is updated based on the light emission time of each sub-pixel in the display of the image, for example, each time the image is displayed on the display panel 2. The accumulated light emission time may be a value defined by the luminance and the light emission time of the light emitting element of each sub-pixel.

The panel driver 5 determines whether or not the target pixel, is a protection target pixel with reference to the accumulated light emission time of the target pixel managed by the panel driver 5 as described above (Step S2). In Step S2, for example, when the accumulated light emission time is a predetermined value or more (hereinafter, referred to as a threshold value), it is determined that the target pixel is a protection target pixel, and when the accumulated light emission time is less than the threshold value, it is determined that the target pixel is not a protection target pixel.

When it is determined that the target pixel is the protection target pixel (YES in Step S2), the panel driver 5 determines whether or not the target pixel is the sub-pixel SR or SB, that is, the sub-pixel SR or SB is the protection target pixel (Step S3).

When it is determined that the target pixel is the sub-pixel SR or SB (that is, it is not the sub-pixel SG) (YES in Step S3), the panel driver 5 executes a first distribution processing (Step S4). This first distribution processing is processing executed to distribute the luminance of the target pixel to the surrounding pixels. In the first distribution processing, the luminance of each pixel is changed so as to decrease the luminance of the target pixel and increase the luminance of the surrounding pixels of the target pixel.

On the other hand, when it is determined that the target pixel is not the sub-pixel SR or SB (that is, it is the sub-pixel SG) (NO in Step S3), the panel driver 5 executes a second distribution processing (Step S5). This second distribution processing is processing of changing the luminance of each pixel so as to decrease the luminance of the target pixel and increase the luminance of the surrounding pixels of the target pixel, but the processing is different from the first distribution processing in Step S4.

That is, in the present embodiment, a processing, which is different from the processing when the sub-pixel SR or SB is the protection target pixel and when the sub-pixel SG is the protection target pixel, is executed. The details of the first distribution processing executed in Step S4 and the second distribution processing executed in Step S5 will be described later.

When the processing in Step S4 or S5 is executed, it is determined whether or not the processing in Steps S2 to S5 is executed for all the sub-pixels included in the plurality of pixels PX disposed on the display panel a (Step S6).

When it is determined that the processing is not executed for all the sub-pixels (NO in Step S6), the processing returns to Step S2 and the processing is repeated. In this case, the processing after Step S2 is executed for the sub-pixel for which the processing is not executed as the target pixel.

On the other hand, when it is determined that the processing is executed for all the sub pixels (YES in Step S6), the panel driver 5 outputs image data including a pixel signal that defines luminance changed in the first distribution processing in Step S4, and the second distribution processing in Step S5 (Step S7).

In the present embodiment, the burden of the protection target (that is, the light emission amount of the protection target pixel) can be reduced by displaying the image based on the image data output in Step S7, that is, the image data in which the luminance of the protection target pixel is decreased.

Figure 7:
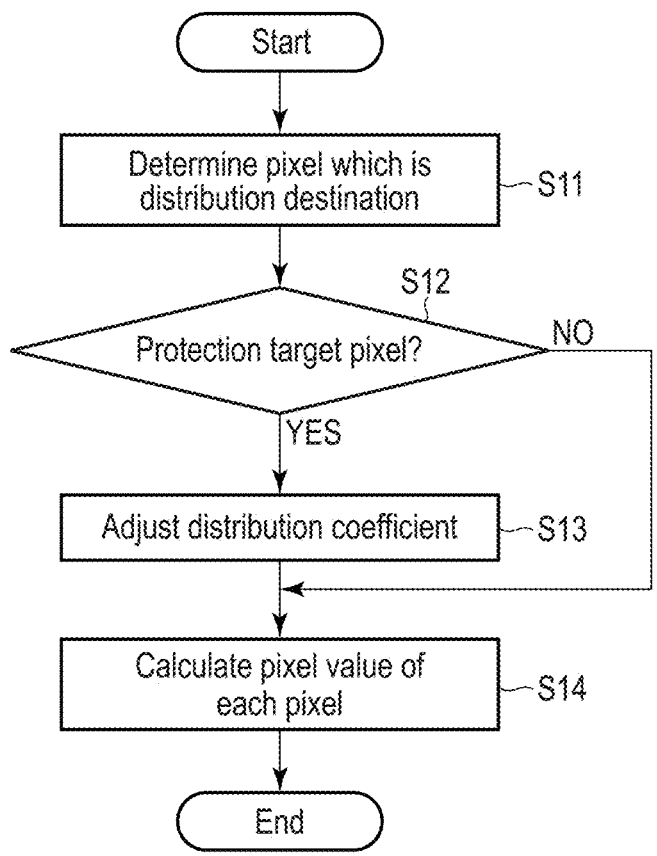
FIG. 7 is a flowchart illustrating an example of a processing procedure on a first distribution processing.

Next, the processing procedure of the above-described first distribution procession (the processing in Step S4 illustrated in FIG. 6) will be described with reference to the flowchart of FIG. 7. The first distribution processing is executed when the sub-pixel SR or SB is the protection target pixel as described above. In FIG. 7, the sub-pixel SR is the protection target pixel, and the sub-pixel SR that is the protection target pixel is referred to as a protection target pixel SR for convenience.

First, the panel driver 5 determines the pixel to which luminance of the protection target pixel SR is distributed (Step S11). The pixel determined in Step S11 (hereinafter, referred to as a distribution destination pixel) is a sub-pixel SR included in each of surrounding pixels PX of the pixel PX including the protection target pixel SR. Specifically, for example, the panel driver 5 determines, as the distribution destination pixel, the sub-pixel SR included in each of the plurality of pixels PX which are disposed so as to form a predetermined pattern with respect to the pixel PX including the protection target pixel SR as shown in FIGS. 3 to 5. Hereinafter, the sub-pixel SR determined as the distribution destination pixel in Step S11 is referred to as a distribution destination pixel SR for convenience. In the following description, it is described that a plurality of distribution destination pixels SR are determined in Step S11, but the number of the distribution destination pixels SR may be one.

In the present embodiment, the luminance of the protection target pixel SR is distributed to the distribution destination pixel SR determined in Step S11 described above, but an amount of the luminance distributed to the distribution destination pixel SR from the protection target pixel SR (hereinafter, referred to as a distribution amount) is predetermined for each of the distribution destination pixel SR as a distribution coefficient (a distribution ratio). In the present embodiment, the distribution coefficient is a value indicating a ratio of the amount of the luminance to be distributed to the maximum luminance of the protection target pixel SR. That is, when the distribution coefficient determined for the distribution destination pixel SR is 50%, the luminance corresponding to 50% of the maximum luminance of the protection target pixel SR among the luminance of the protection target pixels SR is distributed to the distribution destination pixel SR.

Next, the panel driver 5 determines whether or not at least one of the distribution destination pixels SR determined in Step S11 is the protection target pixel (Step S12). Since the processing in Step S12 is the same as the processing in Step S2 illustrated in FIG. 6 described above, the details thereof will be omitted here.

When it is determined that at least one of the distribution destination pixels SR is the protection target pixel (YES in Step S12), the panel driver 5 adjusts a distribution coefficient determined for the distribution destination pixel SR determined to be the protection target pixel (Step S13). In step S13, for example, the processing of adjusting (changing) the distribution coefficient determined for each of the distribution destination pixels SR is executed so as to reduce the amount of the luminance distributed to the distribution destination pixel SR determined to be the protection target pixel and increase the amount of the luminance distributed to a distribution destination pixel SR other than the distribution destination pixel SR (the protection target pixel).

When it is determined that all of the distribution destination pixels SR are not the protection target pixels (NO in Step S12), the processing in Step S13 described above is not executed.

Next, the panel driver 5 calculates a signal value (a pixel value) of the pixel signal defining luminance of each of the protection target pixels SR and the distribution destination pixel SR determined in Step S11 based on the pixel signal included in the image data acquired in Step S1 illustrated in FIG. 6 and the above described distribution coefficient (Step S14).

According to this, the signal value of the pixel signal which is included in the image data and defines the luminance of each of the protection target pixel SR and the distribution destination pixel SR is changed to the pixel value calculated in Step S14. The image data including the pixel value (the pixel signal) calculated in Step S14 is output in Step S7 illustrated in FIG. 6 described above.

Here, the first distribution processing will be specifically described with reference to FIG. 3 described above. Here, it is described that the pixel PX including the protection target pixel SR is the pixel 101 shown on the left side of FIG. 3. In the following description, the signal value of the pixel signal that defines the luminance of each pixel is referred to as a pixel value of the pixel for convenience.

The pixel value of the pixel 101 including the protection target pixel SR included in the image data acquired in Step S1 illustrated in FIG. 6 is (255, 255, 255). That is, the pixel value of each of the sub-pixels SR, SG, and SB included in the pixel 101 is 255 (the pixel value that defines the maximum luminance), and the pixel 101 displays a white color.

The pixel value of the plurality of pixels PX other than the pixel 101 included in the image data acquired in Step S1 illustrated in FIG. 6 is (0, 0, 0). That is, the pixel value of each of the sub-pixels SR, SG, and SB included in the pixel PX other than the pixel 101 is 0, and the plurality of pixels PX display a black color.

When the first distribution processing illustrated in FIG. 7 is executed for the protection target pixel SR, the sub-pixel SR included in each of the pixels disposed so as to form a predetermined pattern with respect to the pixel 101 including the protection target pixel SR is determined as the distribution destination pixel in Step S11. Here, the sub-pixel SR included in each of the pixels 102 to 105 shown on the right side of FIG. 3 is determined as the distribution destination pixel.

In the following description, the sub-pixel SR included in of the pixels 102 to 105 determined as the distribution destination pixel referred to as distribution destination pixels SR1 to SR4.

Here, when all of the distribution destination pixels SR1 to SR4 are not the protection target pixels, the processing in Step S14 is executed. In the processing in Step S14, the pixel value of each of the protection target pixel SR and the distribution destination pixels SR1 to SR4 is calculated.

Hereinafter, the pixel value of each of the protection target pixel SR and the distribution destination pixels SR1 to SR4 calculated in Step S14 will be specifically described. The distribution coefficient for each of the distribution destination pixels SR1 to SR4 is predetermined to be 25%.

First, the pixel value of the protection target pixel SR will be described. When the distribution coefficient for each of the distribution destination pixels SR1 to SR4 is determined to be 25%, the luminance of the protection target pixel SR is distributed to each of the distribution destination pixels SR1 to SR4 by 25% of the maximum luminance. Since the luminance of the protection target pixel SR is the maximum luminance (the pixel value is 255), the pixel value of the protection target pixel SR after the luminance is distributed (that is, the pixel value of the sub-pixel SR included in the pixel 101) is calculated to be 0.

When the pixel value of the pixel 101 before the luminance is distributed is (255, 255, 255) as described above, the pixel value of the pixel 101 after the luminance is distributed is (0, 255, 255).

Next, the pixel value of the distribution destination pixel SR1 will be described. When the distribution coefficient for the distribution destination pixel SR1 is determined to be 25% as described above, the luminance corresponding to 25% of the maximum luminance among the luminance of the protection target pixel values SR is distributed to the distribution destination pixel SR1.

Here, the pixel value that defines the luminance corresponding to 25% of the maximum luminance of the protection target pixel SR is 132. Therefore, the pixel value of the distribution destination pixel SR (that is, one pixel value of toe sub-pixel SR included in the pixel 102) after the luminance is distributed is calculated to be 132.

When the pixel value of the pixel 102 before the luminance is distributed is (0, 0, 0) as described above, the pixel value of the pixel 102 after the luminance is distributed is (132, 0, 0).

Here, the pixel value of the distribution destination pixel SR1 is described, but the same applies to pixel values of the other distribution destination pixels SR2 to SR4. That is, the pixel value of the pixels 103 to 105 after the luminance is distributed is (132, 0, 0), which is the same as the pixel value of the pixel 102.

When the luminance of the protection target pixel SR is distributed to the distribution destination pixels SR1 to SR4 as described above, the pixel value of the pixel 101 is changed from (255, 255, 255) to (0, 255, 255), and the pixel value of each of the pixels 102 to 105 is changed from (0, 0, 0) to (132, 0, 0).

When the image is displayed based on the image data including the pixel value, the burden of the protection target pixel SR can be reduced since it is not necessary to cause the protection target pixel SR (the sub-pixel SR included in the pixel 101) to emit light. The luminance to be secured by the light emission of the protection target pixel SR can be supplemented by the distribution destination pixels SR1 to SR4.

Here, a case where all of the distribution destination pixels SR1 to SR4 are not the protection target pixels (that is, the accumulated light emission time is less than the threshold value) is described, but when at least one of the distribution destination pixels SR1 to SR4 is the protection target pixel, Step S13 illustrated in FIG. 7 is executed to adjust the distribution coefficient for the protection target pixel.

Hereinafrer, a specific example of the processing in Step S13 will be described. Here, it is assumed that the distribution destination pixel SR1 of the distribution destination pixels SR1 to SR4 is the protection target pixel.

Here, the distribution coefficient for each of the distribution destination pixels SR1 to SR4 is 25% as described above. When the distribution destination pixel SR1 is the protection target pixel, in Step S13, for example, the processing of reducing the distribution coefficient for the distribution destination pixel SR1 and increasing the distribution coefficient for the distribution pixels SR2 to SR4 other than the distribution destination pixel 102 executed.

Specifically, for example, the distribution coefficient for the distribution destination pixel SR1 is from 25% to 10%, and the distribution coefficient for each of the distribution destination pixels SR2 to SR4 is from 25% to 30%.

In this case, as the pixel value of the distribution destination pixel SR1 after the luminance is distributed, a pixel value that defines the luminance corresponding to 10% of the maximum luminance is calculated. On the other hand, as the pixel value of the distribution destination pixels SR2 to SR4 after the luminance is distributed, a pixel value that defines the luminance corresponding to 30% of the maximum luminance is calculated.

According to this, for example, when the distribution destination pixel SR1 is the protection target pixel, the burden of the distribution destination pixel SR1 can be reduced by adjusting the distribution coefficient for each of the distribution destination pixels SR1 to SR4.

Here, it is described that the distribution coefficient for the distribution destination pixel SR1 which is the protection target pixel is reduced, but the distribution coefficient for the distribution destination pixel SR1 may be adjusted to be 0. When the distribution coefficient for the distribution destination pixel SR1 is set to be from 25% to 0%, the distribution coefficient for each of the other distribution destination pixels SR2 to SR4 may be set to be from 25% to 33.3%. According to this, the burden of the distribution destination pixel SR1 which is the protection target pixel can be further reduced. For example, when the distribution destination pixel SR1 is the protection target pixel, the distribution destination pixel SR1 may be changed to another pixel (a sub-pixel SR).

Here, when a definition of the display panel 2 is high (that is, the display panel 2 is a high definition panel), the pixel is small. Therefore, even when an amount of the luminance distributed to the distribution destination pixels SR1 to SR4 from the protection target pixel SR is large as described above, a change in a color is difficult to recognize visually.

On the other hand, when the definition of the display panel 2 is low, the pixel is larger than that of the high definition panel. Therefore, when the amount of the luminance distributed to the distribution destination pixels SR1 to SR4 from the protection target pixel SR is large, a change in a color is easy to recognize visually.

Therefore, when the definition of the display panel 2 is low, the amount of the luminance distributed to the distribution destination pixels SR1 to SR4 from the protection target pixel SR1 may be suppressed. Specifically, when the definition of the display panel 2 is high, the distribution coefficient for each of the distribution destination pixels SR1 to SR4 can be 25% as described above, and when the definition of the display panel 2 is low, the distribution coefficient for each of the distribution destination pixels SR1 to SR4 can be, for example, 12.5%.

When the distribution coefficient for each of the distribution destination pixels SR1 to SR4 is 12.5%, the luminance corresponding to 50% of the maximum luminance among the luminance of the protection target pixels SR is distributed to each of the distribution destination pixels SR1 to SR4 by 12.5%.

Here, when the pixel value of the protection target pixel SR before the luminance is distributed is 255 (the luminance of 100%), the pixel value that defines remaining luminance of the protection target pixel SR when 50% of the luminance of the protection target pixel SR is distributed to each of the distribution destination pixels SR1 to SR4 (the luminance corresponding to 50% of the maximum luminance) is 186. Therefore, when the distribution coefficient for each of the distribution destination pixels SR1 to SR4 is 12.5%, the pixel value of the protection target pixel SR after the luminance is distributed is calculated to be 186.

On the other hand, the pixel value that defines the luminance corresponding to 12.5% of the maximum luminance distributed to each of the distribution destination pixels SR1 to SR4 is 65. Therefore, when the distribution coefficient for each of the distribution destination pixels SR1 to SR4 is 12.5%, the pixel value of each of the distribution destination pixels SR1 to SR4 after the luminance is distributed is calculated to be 65.

As described above, for example, when the definition of the display panel 2 is high and the distribution coefficient for each of the distribution destination pixels SR1 to SR4 is 25%, the pixel value of the pixel 101 including the protection target pixel SR is (0, 255, 255), and the pixel value of each of the pixels 102 to 105 including each of the distribution destination pixels SR1 to SR4 is (132, 0, 0).

On the other hand, when the definition of the display panel 2 is low and the distribution coefficient for each of the distribution destination pixels SR1 to SR4 is 12.5%, the pixel value of the pixel 101 is (186, 255, 255), and the pixel value of each of the pixels 102 to 105 is (65, 0, 0).

In this case, since the protection target pixel SR included in the pixel 101 needs to emit light with the luminance defined by the pixel value of "186" (the luminance corresponding to 50% of the maximum luminance), a reduction rate of the burden of the protection target pixel SR decreases. However, a difference among the luminance of each of the pixels 101 to 105 before and after the luminance is distributed can be reduced by suppressing the amount of the luminance distributed to the distribution destination pixel SR1 to SR4 from the protection target pixel SR. According to this, even when the definition of the display panel 2 is low, it can be made to difficult to visually recognize the change in a color due to the distribution of luminance.

As described above, in the present embodiment, the distribution coefficient (the distribution amount of the luminance) for the distribution destination pixels SR1 to SR4 may be different based on the definition of the display panel 2. For example, when a resolution is about 350 ppi, the pixel may not be visually recognized from a distance of 25 cm. Therefore, when the resolution of the display panel 2 is 350 ppi or higher, the distribution coefficient when the definition of the display panel 2 is high (for example, 25%) may be adopted, and when the resolution of the display panel 2 is less than 350 ppi, the distribution coefficient when the definition of the display panel 2 is low (for example, 12.5%) may be adopted. The high or low definition of the display panel 2 may be determined by other criterion.

When the luminance of the protection target pixel SR is high, the burden of the protection target pixel SR becomes large. Therefore, in order to appropriately reduce the burden of the protection target pixel SR, the distribution coefficient may be changed depending on the luminance (the pixel value) of the protection target pixel SR. Further, even when the distribution coefficient is not changed, the burden of the protection target pixel SR may be further reduced by increasing the number of the distribution destination pixels according to the luminance of the protection target pixel SR.

It is described that the same distribution coefficient is determined for the distribution destination pixels SR1 to SR4, but when a decrease in the image quality can be suppressed by the distribution of the luminance from the protection target pixel SR, different distribution coefficients may be determined for the distribution destination pixels SR1 to SR4 depending on a positional relationship with respect to the protection target pixel SR.

Here, the first distribution processing executed mainly when the sub-pixel SR is the protection target pixel is described, but when the sub-pixel SB is the protection target pixel, the same processing as in the above description is executed except that the sub-pixel SB is determined as the distribution destination pixel. Therefore, detailed description of the first distribution processing executed when the sub-pixel SB is the protection target pixel will be omitted.

Figure 8:
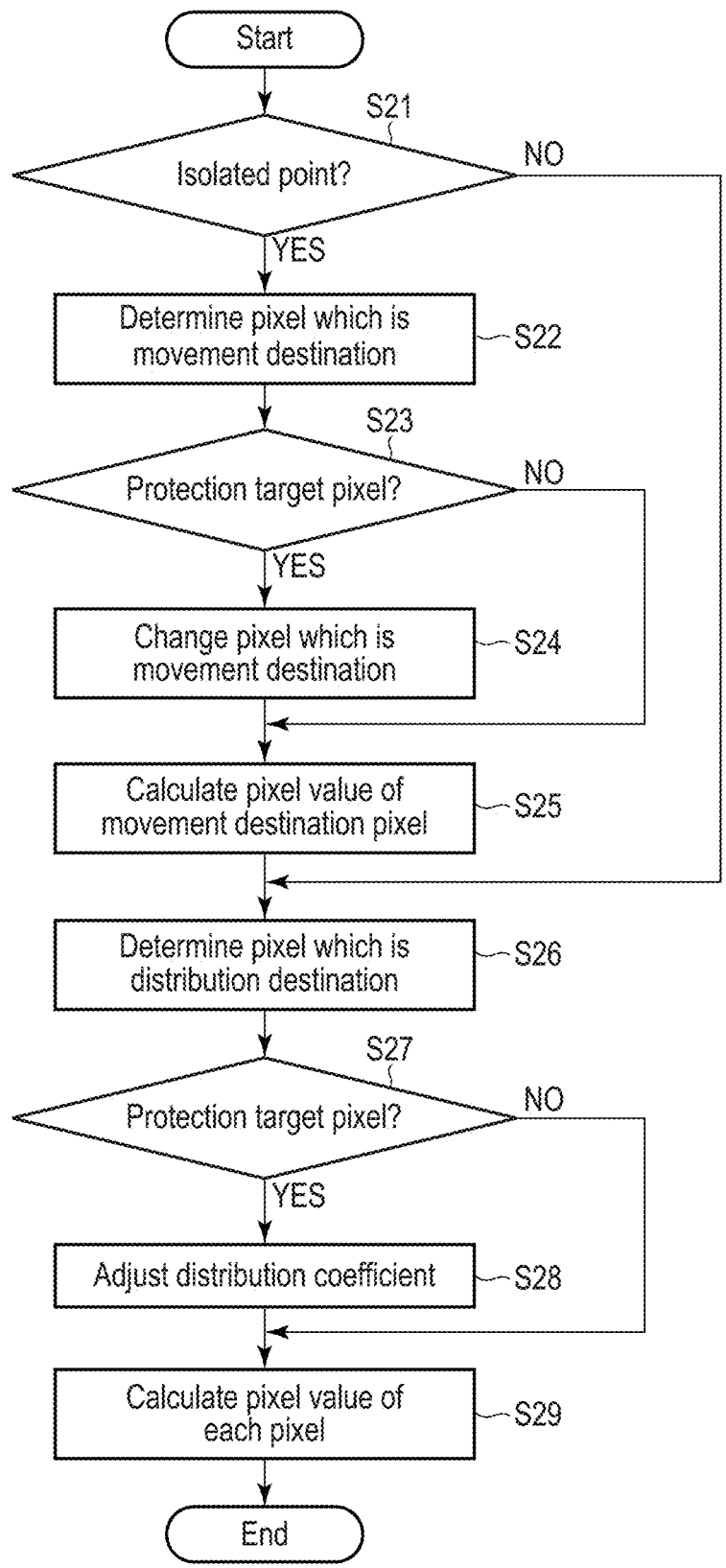
FIG. 8 is a flowchart illustrating an example of a processing procedure of a second distribution processing.

Next, the processing procedure of the above-described second distribution processing (the processing in Step S5 illustrated in FIG. 6) will be described with reference to the flowchart of FIG. 8. The second distribution processing is executed when the sub-pixel SG is the protection target pixel as described above. In FIG. 8, the sub-pixel SG, which is the protection target pixel, is referred to as a protection target pixel SG for convenience.

First, the panel driver 5 determines whether or not the pixel PX including the protection target pixel SG is an isolated point based on the image data acquired in Step S1 illustrated in FIG. 6 (Step S21).

In the present embodiment, "the pixel PX is an isolated point" means that a color displayed by the pixel PX is different from a color displayed by the surrounding pixels PX (the ether pixels PX adjacent to the pixel PX). That is, as described with reference to FIG. 3 described above, for example, when the pixel value of the pixel 101 is (255, 255, 255), and the pixel value of the surrounding pixels PX of the pixel 101 is (0, 0, 0), the pixel 101 is determined to be the isolated point. The color displayed by each pixel PX can be discriminated based on the pixel signal (the pixel value) included in the image data.

Here, when the luminance of the protection target pixel SG (that is, green) is distributed to the surrounding pixels as described above, blurring occurs in the image after the luminance is distributed. Therefore, in the present embodiment, when the pixel PX including the protection target pixel SG is the isolated point, the luminance of the pixel PX including the protection target pixel SG is moved (shifted) to the surrounding pixels PX (the adjacent pixels PX).

When it is determined that the pixel PX including the protection target pixel SG is the isolated point as described above (YES in Step S21), the panel driver 5 determines a pixel which is a movement destination of the luminance of the pixel PX including the protection target pixel SG (Step S22). The pixel determined in Step S22 (hereinafter, referred to as a movement destination pixel) is, for example, one of the surrounding pixels PX of the pixel PX including the protection target pixel SG.

Here, the determination processing of the movement destination pixel in Step S22 will be specifically described. In the present embodiment, in order to reduce the influence by the movement of the luminance of the pixel PX including the protection target pixel SG described above, the movement destination pixel is determined as follows.

First, when the image displayed based on the image data is a still image, among the surrounding pixels PX of the pixel PX including the protection target pixel SG, a pixel PX having a color similar to that of the pixel PX is determined as the movement destination pixel. A pixel PX having a color similar to that of the pixel PX including the protection target pixel SG can be discriminated based on the pixel signal included in the image data (the pixel value of each sub-pixel included in the pixel PX).

Further, when the image displayed based on the image data is a moving image, among the surrounding pixels PX of the pixel PX including the protection target pixel SG, a pixel PX, which is positioned in a movement vector direction of the moving image from the pixel PX, is determined as the movement destination pixel. For example, the movement vector direction of the moving image can be obtained from the image data.

When there is a physical movement of an electronic device (a device) including the display device 1, among the surrounding pixels PX of the pixel PX including the protection target pixel SG, a pixel PX, which is positioned in the moving direction from the pixel PX, is determined as the movement destination pixel. In the present embodiment, as the electronic device that moves physically, for example, a head mounted display (HMD) capable of viewing a virtual reality (VR) contents is assumed, and the physical movement of the electronic device can be obtained from various sensors mounted on the electronic device (for example, an acceleration sensor or a gyro sensor).

Hereinafter, the pixel PX determined as the movement destination pixel in Step S22 is referred to as a movement destination pixel PX for convenience.

Next, the panel driver 5 determines whether or not the sub-pixel SR, SG, or SB included in the movement destination pixel PX determined in Step S22 is the protection target pixel (Step S23). Since the processing in Step S23 is the same as the processing in Step S2 illustrated in FIG. 6 described above, the details thereof will be omitted here.

When it is determined that the sub-pixel SR, SG, or SB included in the movement destination pixel PX is the protection target pixel (YES in Step S23), the panel driver 5 changes the movement destination pixel PX determined in step S22 (Step S24). In this case, a new movement destination pixel PX is determined from the pixels PX other than the movement destination pixel PX determined in Step S22 of the surrounding pixels PX of the pixel PX including the protection target pixel SG described above.

When it is determined that the sub-pixels SR, SG, and SB included in the movement destination pixel PX are not the protection target pixels (NO in Step S23), the processing in Step S24 described above is not executed.

In the following description, the movement destination pixel PX is a movement destination pixel PX determined in Step S22 when the processing in Step S24 is not executed, and is a new movement destination pixel PX changed in Step S24 when the processing in Step S24 is executed.

In the present embodiment, when the pixel PX including the protection target pixel SG is the isolated point, the luminance of allot the sub-pixels SR, SG, and SB included in the pixel PX is moved to the movement destination pixel PX. Therefore, the panel driver 5 calculates the pixel value of the sub-pixels SR, SG, and SB included in the movement destination pixel PX based on the pixel signal included in the image data acquired in Step S1 illustrated in FIG. 6 (Step S25). The pixel value of the sub-pixels SR, SG, and SB included in the movement destination pixel PX calculated in Step S25 corresponds to a pixel value that defines luminance obtained by adding the luminance of the pixel PX including the protection target pixel SG to the luminance of the movement destination pixel PX before the luminance is moved.

According to this, the pixel value of the movement destination pixel PX included in the image data is changed to the pixel value calculated in Step S25.

Here, when the image is displayed based on the image data in which the luminance of the pixel PX including the protection target pixel SG is moved to the movement destination pixel PX (that is, the image data including the pixel value calculated in Step S25), discomfort may occur when the image is visually recognized due to a movement of a barycenter. Therefore, in the present embodiment, when the luminance of the pixel PX including the protection target pixel SG is moved to the movement destination pixel PX, the luminance of the sub-pixels SR and SG included in the movement destination pixel PX (that is, the sub-pixel other than the sub-pixel SG) is distributed (dispersed) in a movement source direction, and influence due to the movement of the barycenter is reduced. The movement source direction is a direction of the pixel PX including the protection target pixel SG from the movement destination pixel PX (that is, a movement source pixel PX).

Therefore, the panel driver 5 determines the pixel which is a destination, to which the luminance of the sub-pixels SR, and SB included in the movement destination pixel PX is distributed, based on the movement source direction described above (Step S26). The pixel determined in Step S26 (hereinafter, referred to as a distribution destination pixel) includes sub-pixels SR, and SB included in each of the pixels PX positioned in the movement source direction from the movement destination pixel PX.

Hereinafter, the sub-pixels SR, and SB determined as the distribution destination pixel in Step S26 are referred to as distribution destination pixels SR, and SB respectively. Although each of the distribution destination pixels SR, and SB is described as plural distribution destination pixels, each of the distribution destination pixels SR, and SB may be one distribution destination pixel. Each of the sub-pixels SR, and SB included in the movement destination pixel PX is referred to as distribution source pixels SR, and SB respectively.

The amount of the luminance distributed to the distribution destination pixel SR from the distribution source pixel SR is predetermined as a distribution coefficient for each distribution destination pixel SR. Similarly, the amount of the luminance distributed to the distribution destination pixel SB from the distribution source pixel SB is predetermined as a distribution coefficient for each distribution destination pixel SB.

Next, the panel driver 5 determines whether or not the distribution destination pixel SR or SB determined in Step S26 is the protection target pixel (Step S27). Since the processing in Step S27 is the same as the processing in Step S2 illustrated in FIG. 6, the details thereof will be omitted here.

When it is determined that the distribution destination pixel SR or SB is the protection target pixel (YES in Step S27), the panel driver 5 adjusts a distribution coefficient defined for the distribution destination pixel SR or SB determined to be the protection target pixel (Step S28).

Specifically, for example, when it is determined that at least one of the distribution destination pixel SR is the protection target pixel, in step S28, the processing of adjusting (changing) the distribution coefficient defined for each of the distribution destination pixels SR is executed so as to reduce the amount of the luminance distributed to the distribution destination pixel SR determined to be the protection target pixel and increase the amount of the luminance distributed to a distribution destination pixel SR other than the distribution destination pixel SR (the protection target pixel). Similarly, for example, when it is determined that at least one of the distribution destination pixel SB is the protection target pixel, in step S28, the processing of adjusting (changing) the distribution coefficient defined for each of the distribution destination pixels SB is executed so as to reduce the amount of the luminance distributed to the distribution destination pixel SB determined to be the protection target pixel and increase the amount of the luminance distributed to a distribution destination pixel SB other than the distribution destination pixel SB (the protection target pixel).

When it is determined that the distribution destination pixels SR, and SB are not the protection target pixels (NO in Step S27), the processing in Step S28 described above is not executed.

Next, the panel driver 5 calculates each pixel value of the distribution source pixel SR, the distribution destination pixel SR, distribution source pixel SB, and distribution destination pixel SB based on the pixel signal included in the image data acquired in Step S1 illustrated in FIG. 6 and the above described distribution coefficient (Step S29).

According to this, the pixel value of each of the distribution source pixel SR, the distribution destination pixel SR, the distribution source pixel SB, and the distribution destination pixel SB, which are included in the image data, is changed to the pixel value calculated in Step S29.

The image data including the pixel value (the image signal) calculated in Step S29 is output in Step S7 illustrated in FIG. 6 described above.

Here, a case where the pixel PX including the protection target pixel SG is the isolated point is described, but when it is determined that the pixel PX including the protection target pixel SG is not the isolated point in Step S21 (NO in step S21), a processing after Step S26 is executed.

The "pixel PX is not the isolated point" means that, for example, the color displayed by the pixel PX is the same as the color displayed by the surrounding pixels PX of the pixel PX. Specifically, when the image displayed based on the image data is, for example, a solid image (a screen) in which the same color is displayed in all of the plurality of pixels PX, it is determined that the pixel PX including the protection target pixel SG is not the isolated point.

The processing after Step S26 executed in this case (the processing in Steps S26 to S29) is the same as the processing in Steps S11 to S14 illustrated in FIG. 7. That is, when the pixel PX including the protection target pixel SG is not the isolated point, the luminance of the protection target pixel SG is distributed to the sub-pixel SG included in each of the surrounding pixels PX of the pixel PX including the protection target pixel SG.

As described above, according to the second distribution processing illustrated in FIG. 8, when the pixel PX including the protection target pixel SG is the isolated point, a processing of moving the luminance of the pixel PX to the movement destination pixel PX is executed, and when the pixel PX including the protection target pixel SG is not the isolated point, a processing of distributing the luminance of the protection target pixel SG included in the pixel PX is executed.

Hereinafter, the second distribution processing will be specifically described. Here, a case where the pixel PX including the protection target pixel SG is the isolated point and a case where the pixel PX including the protection target pixel SG is not the isolated point will be described separately.

First, a case where the pixel PX including the protection target pixel SG is the isolated point will be described with reference to FIGS. 9 and 10. Here, it is described that the pixel PX including the protection target pixel SG is a pixel 201 shown on the left side of FIG. 9.

The pixel value of the pixel 201 including the protection target pixel SG included in the image data acquired in Step S1 illustrated in FIG. 6 is (255, 255, 255). That is, the pixel value of each of the sub-pixels SR, SG, and SB included in the pixel 201 is 255, and the pixel 201 displays a white color.

The pixel value of a plurality of the pixels PX other than the pixel 201 included in the image data acquired in Step S1 illustrated in FIG. 6 is (0, 0, 0). That is, the pixel value of each of the sub-pixels SR, SG, and SB included in the pixel PX other than the pixel 201 is 0, and the plurality of the pixels PX display a black color.

Figure 9:
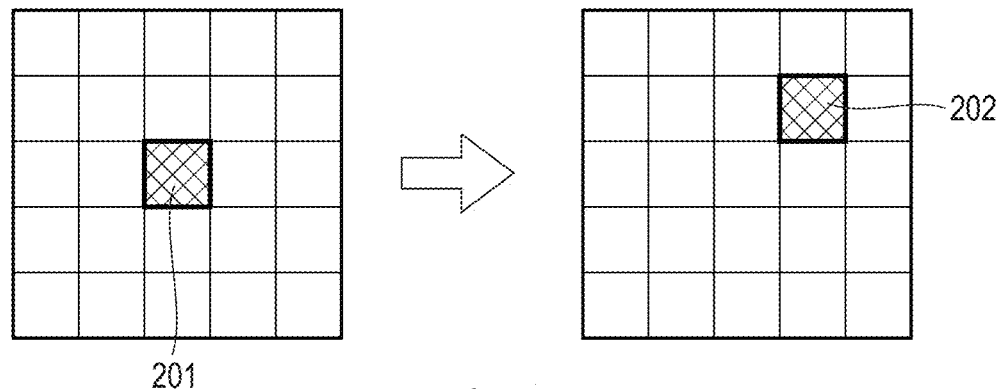
FIG. 9 is a diagram for specifically explaining the second distribution processing when a pixel is an isolated point.
Figure 10:
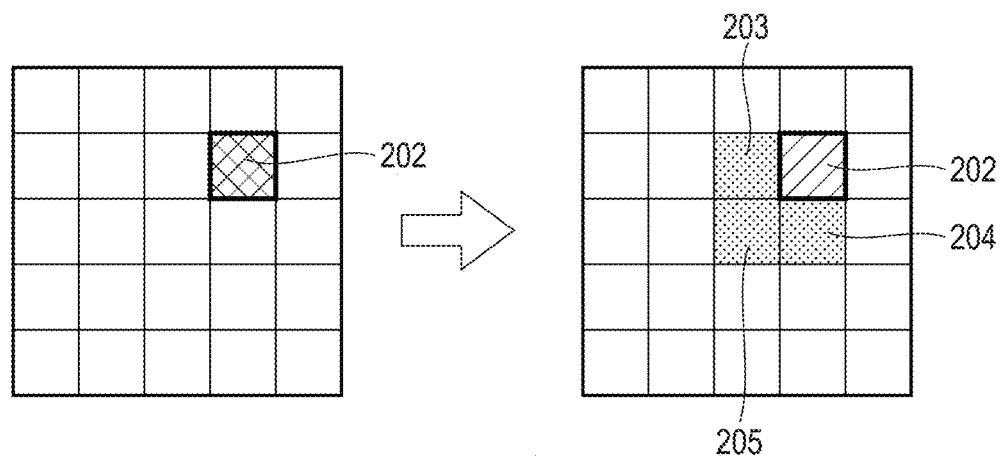
FIG. 10 is a diagram for specifically explaining the second distribution processing when a pixel is an isolated point.

That is, on the left side of FIG. 9, the pixel 201 including the protection target pixel SG has a different color from that of the surrounding pixels PX of the pixel 201. Therefore, in Step S21 illustrated in FIG. 8, it is determined that the pixel 201 is the isolated point.

Next, in Step S22, the pixel (the movement destination pixel), which is a movement destination to which the luminance of the pixel 201 is moved, is determined. Here, the pixel 202 shown on the right side of FIG. 9 is determined as the movement destination pixel (hereinafter, referred to as the movement destination pixel 202). In the example shown in FIG. 9, the movement destination pixel 202 is the pixel PX positioned in the upper right side of the pixel 201 including the protection target pixel SG. Since the details of the processing of determining the movement destination pixel are as described in FIG. 8, the detailed description thereof will be omitted here.

When the sub-pixels SR, SG, and SB included in the movement destination pixel 202 determined in this way are not the protection target pixels, the luminance of the pixel 201 including the protection target pixel SG is moved to the movement destination pixel 202. In this case, the pixel value of the pixel 201 is changed from (255, 255, 255) described above to (0, 0, 0).

On the other hand, the pixel value of the movement destination pixel 202 is (0, 0, 0), and the luminance of the pixel 201 described above is moved. Therefore, in Step S25 illustrated in FIG. 8, the pixel value of the movement destination pixel 202 is calculated to be (255, 255, 255).

Here, it is described that the sub-pixels SR, SG, and SB included in the movement destination pixel 202 are not the protection target pixels, but when the sub-pixel SR, SG, or SB is the protection target pixel, the movement destination pixel is changed to the pixel PX other than the pixel 202.

When the sub-pixel SR, SG or SB included in the movement destination pixel 202 is the protection target pixel, for example, only a part of the luminance may be moved instead of moving all of the luminance to the sub-pixel which is the protection target pixel, and the luminance may be distributed to a plurality of pixels including the sub-pixel (that is, the distribution coefficient may be adjusted).

Here, as described with reference to FIG. 8, when the luminance of the pixel 201 including the protection target pixel SG is moved to the movement destination pixel 202 in the second distribution processing, the luminance of the sub-pixels SR and SB included in the movement destination pixel 202 is distributed in the movement source direction.

Hereinafter, the distribution of the luminance of the sub-pixels SR and SB included in the movement destination pixel 202 will be specifically described with reference to FIG. 10.

In Step S26 illustrated in FIG. 8, the pixel PX positioned in the movement source direction of the movement destination pixel 202 described above is specified.

Here, the movement source direction of the movement destination pixel 202 is a direction of the pixel 201 including the protection target pixel SG when viewed from the movement destination pixel 202. In this case, the pixel PX disposed so as to form a predetermined pattern in the movement source direction from the movement destination pixel 202 is specified. Here, the pixels 203 to 205 shown on the right side of FIG. 10 are specified. According to this, the sub-pixels SR and SB included in each of the pixels 203 to 205 are determined as the distribution destination pixel.

In the following description, the sub-pixel SR included in each of the pixels 203 to 205 determined as the distribution destination pixel is referred to as distribution destination pixels SR11 to SR13, and the sub-pixel SB included in each of the pixels 203 to 205 is referred to as distribution destination pixels SB11 to SB13. Each of the sub-pixels SR, and SB included in the movement destination pixel 202 is referred to as the distribution source pixels SR, and SB respectively.

When all of the distribution destination pixels SR11 to SR13 and the distribution destination pixels SB11 to SB13 are not the protection target pixels which are described above, the processing in Step S29 is executed.

In the processing in Step S29, the pixel value of each of the distribution source pixel SR, the distribution destination pixels SR11 to SR13, the distribution source pixel SB, and the distribution destination pixels SB11 to SB13 is calculated.

First, the pixel value of each of the distribution source pixel SR and the distribution destination pixels SR11 to SR13 calculated in Step S29 will be specifically described.

Here, the luminance of the pixel 201 including the protection target pixel SG described above is moved to the movement destination pixel 202, and thus the pixel value of the movement destination pixel 202 is (255, 255, 255). That is, the pixel value of the distribution source pixel SR (that is, the sub-pixel SR included in the movement destination pixel 202) is 255.

The luminance corresponding to 50% of the maximum luminance among the luminance of the distribution source pixel SR is distributed to the distribution destination pixels SR1 to SR3, and a distribution coefficient for each of the distribution destination pixels SR1 to SR3 is determined to be about 16.7% (that is, 50/3).

Here, the pixel value that defines the remaining luminance of the distribution source pixel SR (the luminance corresponding to 50% of the maximum luminance) when the luminance corresponding to 50% of the maximum luminance among the luminance of the distribution source pixel SR (the maximum luminance) is distributed to the distribution destination pixels SR11 to SR13 is 186. Therefore, the pixel value of the distribution source pixel SR after the luminance is distributed is calculated to be 186.

On the other hand, the pixel value that defines the luminance corresponding to 16.7% of the maximum luminance distributed to each of the distribution destination pixels SR11 to SR13 is 112. Therefore, the pixel value of each of the distribution destination pixels SR11 to SR13 after the luminance is distributed is calculated to be 112.

Here, the pixel value of each of the distribution source pixel SR and the distribution destination pixels SR11 to SR13 is described, but the same applies to the pixel value of each of the distribution source pixel SR and the distribution destination pixels SB11 to SB13.

That is, the pixel value that defines the remaining luminance of the distribution source pixel SB (the luminance corresponding to 50% of the maximum luminance) when the luminance corresponding to 50% of the maximum luminance among the luminance of the distribution source pixel SB (the maximum luminance) is distributed to the distribution destination pixels SB11 to SB13 is 186. Therefore, the pixel value of the distribution source pixel SR after the luminance is distributed is calculated to be 186.

On the other hand, the pixel value that defines the luminance corresponding to 16.7% of the maximum luminance distributed to each of the distribution destination pixels SB11 to SR13 is 112. Therefore, the pixel value of each of the distribution destination pixels SB11 to SB13 after the luminance is distributed is calculated to be 112.

As described above, since the luminance of the pixel 201 including the protection target pixel SG is moved to the movement destination luminance 202, the pixel value of the pixel 201 is (0, 0, 0). The pixel value or each of the other pixels 203 to 205 is similarly (0, 0, 0).

Therefore, when the processing in Step S29 described above is executed, the pixel value of the movement destination pixel 202 is changed from (255, 255, 255) to (186, 255, 186), and the pixel value of each of the pixels 203 to 205 is changed from (0, 0, 0) to (112, 0, 112).

When the image is displayed based on the image data including the pixel value, the burden of the protection target pixel SG can be reduced since it is not necessary to cause the light emitting element including the protection target pixel SG included in the pixel 201 to emit light. The luminance to be secured by the light emission of the protection target pixel SG can be supplemented by the sub-pixel SG included in the movement destination pixel 202. Further, the influence due to the movement of the barycenter when the luminance of the pixel 201 is moved to the movement destination pixel 202 can be reduced by distributing the luminance of the sub-pixel SR and the sub-pixel SB included in the movement destination pixel 202 to the sub-pixel SR and the sub-pixel SB included in each of the pixels 203 to 205.

Here, a case where all of the distribution destination pixels SR11 to SR13 and the distribution destination pixels SB11 to SB13 are not the protection target pixels is described, but when at least, one of the distribution destination pixels SR11 to SR13 and the distribution destination pixels SB11 to SB13 is the protection target pixel, the processing in Step S23 illustrated in FIG. 8 is executed to adjust the distribution coefficient for the protection target pixel. Since the details of the adjustment of the distribution coefficient are as described above, the detailed description thereof will be omitted here.

Here, it is described that the same distribution coefficient is determined for the distribution destination pixels SR11 to SR13 and the distribution destination pixels SB11 to SB13, but when a decrease in the image quality can be suppressed by the movement or distribution of the luminance of each pixel, different distribution coefficients may be determined for the distribution destination pixels SR11 to SR13 and the distribution destination pixels SB11 to SB13. A different distribution coefficient may be determined for each of the distribution destination pixels SR11 to SR13 depending on a positional relationship with respect to the movement destination pixel 202. Similarly, a different distribution coefficient may be determined for each of the distribution destination pixels SB11 to SB13 depending on the positional relationship with respect to the movement destination pixel 202.

Next, a case where the pixel PX including the protection target pixel SG is not the isolated point will be described with reference to FIG. 11. When the pixel PX including the protection target pixel SG is not the isolated point, the luminance of the protection target pixel SG is distributed to the surrounding pixels (the sub-pixels SG) of the protection target pixel SG. Here, it is described that the pixel PX including the protection target pixel SG is a pixel 301 shown on the left side of FIG. 11.

The pixel value of the pixel 301 including the protection target pixel SG included in the image data acquired in Step S1 illustrated in FIG. 6 is (128, 128, 128). That is, the pixel value of each of the sub-pixels SR, SG, and SB included in the pixel 301 is 128, and the pixel 301 displays a gray color.

The pixel value of the plurality of pixels PX other than the pixel 301 included in the image data acquired in Step S1 illustrated in FIG. 6 is similarly (128, 128, 128). That is, the pixel value of each of the sub-pixels SR, SG, and SB included in the plurality of the pixels PX other than the pixel 301 is 128, and the plurality of the pixels PX display the gray color similarly to the pixel 301.

That is, here, it is assumed that the image displayed based on the image data acquired in Step S1 illustrated in FIG. 6 is a solid image displayed in the gray color in all of the pixels PX. In this case, the pixel 301 including the protection target pixel SG has the same color as that of the surrounding pixels PX of the pixel 301. Therefore, in Step S21 illustrated in FIG. 8, it is determined that the pixel 301 is not the isolated point.

Next, the sub-pixel SG included in each of the pixels disposed so as to form a predetermined pattern with respect to the pixel 301 including the protection target pixel SG is determined as the distribution destination pixel in Step S26. Here, the sub-pixel SG included in each of the pixels 302 to 305 shown on the right side of FIG. 11 is determined as the distribution destination pixel.

Figure 11:
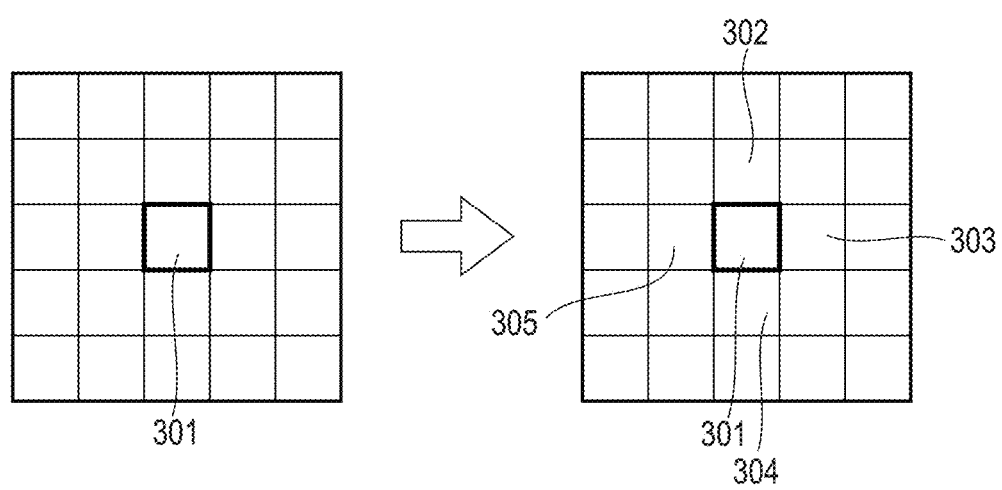
FIG. 11 is a diagram for specifically explaining the second distribution processing when a pixel is not an isolated point.

In the example illustrated FIG. 11, the sub-pixel SG included in each of the pixels 302 to 305 disposed so as to form the same pattern as the case where the sub-pixel SR described above is the protection target pixel is determined as the distribution destination pixel, but for example, the distribution destination pixel may be determined in a different pattern for each of the sub-pixels SR, SG, and SB.

In the following description, the sub-pixel SG included in each of the pixels 302 to 305 determined as the distribution destination pixel is referred to as distribution destination pixels SG1 to SG4 respectively.

Here, when all of the distribution destination pixels SG1 to SG4 are not the protection target pixels, the processing in Step S29 is executed. In the processing in Step S29, the pixel value of each of the protection target pixel SG and the distribution destination pixels SG1 to SG4 is calculated.

Hereinafter, the pixel value of each of the protection target pixel SG and the distribution destination pixels SG1 to SG4 calculated in Step S29 will be specifically described. The distribution coefficient for each of the distribution destination pixels SG1 to SG4 is predetermined to be 2.5%.

First, the pixel value of the protection target pixel SG will be described. When the distribution coefficient for each of the distribution destination pixels SG1 to SG4 is determined to be 2.5% as described above, the luminance of the protection target pixel SG is distributed to each of the distribution destination pixels SG1 to SG4 by 2.5% of the maximum luminance. The pixel value of the protection target pixel SG is 128, but the luminance of the protection target pixel SG corresponds to 21.5% of the maximum luminance. That is, since the luminance corresponding to 10% of the maximum luminance in total among the luminance of the protection target pixel SG is distributed to the distribution destination pixels SG1 to SG4, the luminance of the protection target pixel SG after the luminance is distributed is the luminance corresponding to 11.5% of the maximum luminance. The pixel value that defines the luminance corresponding to 11.5% of the maximum luminance is 96. Therefore, the pixel value of the protection target pixel SG after the luminance is distributed (that is, the pixel value of the sub-pixel SG included in the pixel 301) is calculated to be 96.

When the pixel value of the pixel 301 before the luminance is distributed is (128, 128, 128) as described above, the pixel value of the pixel 301 after the luminance is distributed is (128, 96, 128).

Next, the pixel value of the distribution destination pixel SG1 will be described. When the distribution coefficient for the distribution destination pixel SG1 is determined to be 2.5% as described above, the luminance corresponding to 2.5% of the maximum luminance among the luminance of the protection target pixel SG is distributed to the distribution destination pixel SG1.

Here, the pixel value of the distribution destination pixel SG1 before the luminance is distributed is 128, but the luminance defined by the pixel value corresponds to 21.5% of the maximum luminance as described above. That is, when the luminance corresponding to 2.5% of the maximum luminance is distributed to the distribution destination pixel SG1 from the protection target pixel SG, the luminance of the distribution destination pixel SG1 after the luminance is distributed is the luminance corresponding to 24% (21.5%+2.5%) of the maximum luminance. The pixel value that defines the luminance corresponding to 24% of the maximum luminance is 133. Therefore, the pixel value of the distribution destination pixel SG1 after the luminance is distributed (that is, the pixel value of the sub-pixel SG included in the pixel 302) is calculated to be 133.

When the pixel value of the pixel 302 before the luminance is distributed is (128, 128, 128) as described above, the pixel value of the pixel 302 after the luminance is distributed is (128, 133, 128).

Here, the pixel value of the distribution destination pixel SG1 is described, but the same applies to pixel values of the other distribution destination pixels SG2 to SG4. That is, the pixel value of pixels 303 to 305 after the luminance is distributed is (128, 133, 128), which is the same as the pixel value of the pixel 302.

When the luminance of the protection target pixel SG is distributed to the distribution destination pixels SG1 to SG4 by 2.5% as described above, the pixel value of the pixel 301 is changed from (128, 128, 128) to (128, 96, 128), and the pixel value of each of the pixels 302 to 305 is changed from (128, 128, 128) to (128, 133, 128).

When the image is displayed based on the image data including the pixel value, the light emission amount of the protection target pixel SG (the sub-pixel SG included in the pixel 301) can be suppressed by comparing with a case where the image is displayed based on the image data acquired in Step S1 illustrated in FIG. 6. Therefore, the burden of the protection target pixel SG can be reduced. The luminance to be secured by the light emission of the protection target pixel SG can be supplemented by the distribution destination pixels SG1 to SG4.

Here, a case where all of the distribution destination pixels SG1 to SG4 are not the protection target pixels is described, but when at least one of the distribution destination pixels SG1 to SG4 is the protection target pixel, the processing in Step S28 illustrated in FIG. 8 is executed to adjust the distribution coefficient for the protection target pixel. Since the details of the adjustment of the distribution coefficient are as described above, the detailed description thereof will be omitted here.

Here, it is described that the same distribution coefficient is determined for each of the distribution destination pixels SG1 to SG4, but when a decrease in the image quality can be suppressed by the distribution of the luminance from the protection target pixel SG, different distribution coefficients may be determined for the distribution destination pixels SG1 to SG4 depending on a positional relationship with respect to the protection target pixel SG.

As described above, in the present embodiment, the image is displayed by decreasing the luminance of the protection target pixel (a first pixel) of the plurality of pixels PX and increasing the luminance of the distribution destination pixel (a second pixel) disposed around the protection target pixel. That is, in the present embodiment, by distributing the luminance of the protection target pixel to the surrounding pixels, it is possible to avoid concentrating the burden on a specific pixel (a light emitting element) and extend a life of the light emitting element.

In the present embodiment, for example, when the protection target pixel is the sub-pixel SR, the luminance of the sub-pixel SR is decreased, and the luminance of the sub-pixel SR included in the surrounding pixels PX of the protection target pixel is increased. That is, in the present embodiment, it is possible to extend the life of the light emitting element in a sub-pixel unit.

In the present embodiment, when the sub-pixel SG (a second sub-pixel) is the protection target pixel, the luminance of the pixel PX including the sub-pixel SG is decreased and the luminance of the movement destination pixel PX (the second pixel) is increased, and the luminance of the sub-pixels SR and SB (a first and third sub-pixels) included in the movement destination pixel PX is decreased and the luminance of the sub-pixels SR and SB included the pixel PX (the second pixel) disposed around the movement destination pixel PX is increased. That is, in the present embodiment, blurring caused by simply distributing all of the colors can be prevented and the decrease in the image quality can be suppressed by moving the luminance of the pixel PX including the sub-pixel SG, which is the protection target pixel, to the movement destination pixel PX and distributing the luminance of the sub-pixels SR and SB included in the movement destination pixel PX.

In the present embodiment, when the image displayed on the display panel 2 is a still image, a pixel having a similar color among the plurality of pixels PX disposed around the pixel PX including the sub-pixel SG is the movement destination pixel PX. When the image displayed on the display panel 2 is a moving image, the movement destination pixel PX is determined based on the movement vector of the moving image. The movement destination pixel PX may be determined based on the movement direction of the device on which the display device 1 is mounted. In the present embodiment, such a configuration can make it difficult to visually recognize the influence caused by moving or distributing the luminance of each pixel.

In the present embodiment, the luminance of the sub-pixels SR and SB included in the movement destination pixel PX is distributed in the movement source direction of the movement destination pixel PX (that is, the sub-pixels SR and SB included in the pixel PX disposed in the direction of the pixel PX including the sub-pixel SG which is the protection target pixel). In the present embodiment, the influence caused by the movement of the barycenter when the luminance of the pixel PX including the sub-pixel SG which is the protection target pixel is moved can be reduced by distributing (dispersing) the luminance in the movement source direction in this way.

In the present embodiment, for example, in a case where the image displayed based on the image data is a solid image, when the luminance of the pixel PX including the sub-pixel SG, which is the protection target pixel, is moved to the movement destination pixel PX, the influence caused by the movement of the luminance is large, and the change in a color is visually recognized. Therefore, in the present embodiment, when the pixel PX including the sub-pixel SG, which is the protection target pixel, is an isolated point (that is, the color is different from the surrounding pixels), it can be made to difficult to visually recognize the change in a color by moving the luminance of the pixel PX to the movement destination pixel PX.

In the present embodiment, for example, when the sub-pixel SR or SB is the protection target pixel, an amount that decreases the luminance of the protection target pixel (that is, a distribution amount) may vary depending on the definition of the display panel 2 as described above. According to this, for example, when the definition of the display panel 2 is high, priority is given to reducing the burden of the protection target pixel, and when the definition of the display panel 2 is low, it can be made to difficult to visually recognize the change in a color by reducing the distribution amount of the luminance.

In the present embodiment, when the pixel (the distribution destination pixel) to which the luminance is distributed is the protection target pixel, the amount of the luminance distributed to the protection target pixel may be reduced, and the distribution destination pixel may be changed to another pixel. According to such a configuration, it is possible to suppress an increase in the burden of the distribution destination pixel.

In the present embodiment, a case where the luminance of one protection target pixel is distributed is mainly described, but each of a plurality of pixels PX disposed consecutively includes the protection target pixel, that is, the protection target pixel may exist in each of the plurality of consecutive pixels PX.

In this case, when the luminance of each of the protection target pixels is distributed at the time of displaying the same image, a portion of the pixel PX may be visually recognized as a line due to the decrease in the luminance of the plurality of consecutive pixels PX.

Here, as shown on the left side of FIG. 12, it is assumed that a plurality of pixels 401 to 403 respectively including the protection target pixels exist consecutively. In this case, for example, when a first frame (an image) is displayed, the luminance of the protection target pixel included in the pixels 401 and 403 can be distributed, and when a second frame (an image) following the first frame is displayed, the luminance of the protection target pixel included in the pixel 402 can be distributed.

That is, when a plurality of pixels PX respectively including the protection target pixels are disposed consecutively, a decrease in the image quality due to the decrease in the luminance of the plurality of consecutive pixels PX can be suppressed by distributing the luminance of a part of the plurality of pixels PX (the protection target pixels) and changing a part of the plurality of pixels PX to which the luminance is distributed for each frame.

In the present embodiment, the display device 1 is described as an organic EL display device having an organic EL element, which is a light emitting element. However, the present embodiment, for example, may be applied to an outdoor display device using a large number of light emitting diodes (LEDs) as a light emitting element, or the like.

Hereinafter, the inventions of the embodiments will be cited.

[C1]
A display device including:
display panel on which a plurality of pixels having a light emitting element is disposed; and
a display control unit configured to display an image on the display panel by causing each of the plurality of pixels to emit light based on a pixel signal that defines luminance of each of the plurality of pixels,
wherein the display control unit is configured to display the image by decreasing luminance of a first pixel which is a protection target pixel of the plurality of pixels and increasing luminance of a second pixel disposed around the first pixel.

[C2]
The display device according to [C1], wherein each of the plurality of pixels includes first to third sub-pixels having a light emitting element having a different light emission color, and
the display control unit is configured to decrease the luminance of the first sub-pixel, and increase the luminance of the first sub-pixel included in the second pixel when the pixel, which is a protection target, is the first sub-pixel included in the first pixel.

[C3]
The display device according to [C2], wherein when a sub-pixel, which is the protection target, is the second sub-pixel included in the first pixel, the display control unit is configured to:
decrease luminance of the first pixel;
increase luminance of the second pixel;
decrease luminance of the first and third sub-pixels included in the second pixel; and
increase luminance of the first and third sub-pixels included in a third pixel disposed around the second pixel.

[C4]
The display device according to [C3], wherein when an image displayed on the display panel is a still image, the display control unit is configured to determine a pixel that displays a color similar to a color displayed by the first pixel of a plurality of pixels disposed around the first pixel as the second pixel.

[C5]
The display device according to [C3], wherein when an image displayed on the display panel is a moving image, the display control unit is configured to determine the second pixel of a plurality of pixels disposed around the first pixel based on a movement vector of the moving image.

[C6]
The display device according to [C3], wherein the display control unit is configured to determine the second pixel of a plurality of pixels disposed around the first pixel based on a movement direction of a device mounted on the display device.

[C7]
The display device according to [C3], wherein the third pixel is disposed in a direction of the first pixel with respect to the second pixel.

[C8]
The display device according to [C3], wherein a color displayed by the first, pixel is different from colors displayed by the pixels disposed around the first pixel.

[C9]
The display device according to [C1], wherein an amount that decreases the luminance of the first pixel varies depending on a definition of the display panel.

[C10]
The display device according to [C1], wherein the display control unit is configured to reduce an amount that increases the luminance of the second pixel when the second pixel is the protection target pixel.

[C11]
The display device according to [C1], wherein the display control unit is configured to change the second pixel when the second pixel is the protection target pixel.

[C12]
The display device according to [C1], wherein when a plurality of first pixels, which are the protection target pixels, are disposed consecutively, the display control unit is configured to display an image by decreasing luminance of a part of the plurality of first pixels and increasing luminance of the second pixel disposed around a part of the plurality of first pixels, and
a part of the plurality of first pixels decreasing the luminance is changed for each image displayed on the display panel.

[C13]
A display method executed by a display device including a display panel on which a plurality of pixels having a light emitting element is disposed, and a display control unit configured to display an image on the display panel by causing each of the plurality of pixels to emit light based on a pixel signal that defines luminance of each of the plurality of pixels, the method including:
determining whether or not a first, pixel of the plurality of pixels is a protection target pixel; and
displaying the image by decreasing luminance of the first pixel which is the protection target pixel of the plurality of the pixels and increasing luminance of a second pixel disposed around the first pixel when the first pixel is determined to be a protection target pixel.

[C14]

The display method according to [C13], wherein each of the plurality of pixels includes first to third sub-pixels having a light emitting element having a different light emission color, and the displaying includes decreasing luminance of a first sub-pixel included in the first pixel and increasing luminance of the first sub-pixel included in the second pixel is increased, when the pixel, which is the protection target, is the first sub-pixel included in the first pixel.

[C15]

The display method according to [C14], wherein when a sub-pixel, which is the protection target, is a second sub-pixel included in the first pixel, the displaying includes decreasing luminance of the first-pixel, increasing luminance of the second pixel, decreasing luminance of the first and third sub-pixels included in the second pixel, and increasing luminance of the first and third sub-pixels included in a third pixel disposed around the second pixel.

[C16]

The display method according to [C15], wherein when an image displayed on the display panel is a still image, the displaying includes determining a pixel that displays a color similar to a color displayed by the first pixel of a plurality of pixels disposed around the first pixel as the second pixel.

[C17]

The display method according to [C15], wherein when an image displayed on the display panel is a moving image, the displaying includes determining the second pixel of a plurality of pixels disposed around the first pixel based on a movement vector of the moving image.

[C18]

The display method according to [C15], wherein the displaying includes determining the second pixel of a plurality of pixels disposed around the first pixel based on a movement direction of a device mounted on the display device.

[C19]

The display method according to [C19], wherein the third pixel is disposed in a direction of the first pixel with respect to the second pixel.

[C20]

The display method according to [C15], wherein a color displayed by the first pixel is different from colors displayed by the pixels disposed around the first pixel.

[C21]

The display method according to [C13], wherein an amount that decreases the luminance of the first pixel varies depending on a definition of the display panel.

[C22]

The display method according to [C13], wherein when the second pixel is the protection target pixel, the displaying includes reducing an amount, that increases the luminance of the second pixel.

[C23]

The display method according to [C13], wherein when the second pixel is the protection target pixel, the displaying includes changing the second pixel.

[C24]

The display method according to [C24], wherein when a plurality of first pixels, which are the protection target pixels, are disposed consecutively, the displaying includes displaying the image by decreasing luminance of a part of the plurality of first pixels and increasing luminance of the second pixel disposed around a part of the plurality of first pixels, and a part of the plurality of first pixels decreasing the luminance is changed for each image displayed on the display panel.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a display panel on which a plurality of pixels having a light emitting element is disposed; and
    a display control circuit configured to display an image on the display panel by causing each of the plurality of pixels to emit light based on a pixel signal that defines luminance of each of the plurality of pixels,
    wherein the display control circuit is configured to display the image by decreasing luminance of a first pixel which is a protection target pixel of the plurality of pixels and increasing luminance of a second pixel disposed around the first pixel,
    each of the plurality of pixels comprises first to third sub-pixels having a light emitting element having a different light emission color,
    the display control circuit is configured to decrease the luminance of the first sub-pixel, and increase the luminance of the first sub-pixel included in the second pixel when the pixel, which is a protection target, is the first sub-pixel included in the first pixel, and
    when a sub-pixel which is the protection target, is the second sub-pixel included in the first pixel, the display control circuit is configured to:
    decrease luminance of the first pixel;
    increase luminance of the second pixel;
    decrease luminance of the first and third sub-pixels included in the second pixel; and
    increase luminance of the first and third sub-pixels included in a third pixel disposed around the second pixel.

2. The display device according to claim 1, wherein when the image displayed on the display panel is a still image, the display control circuit is configured to determine a pixel that displays a color similar to a color displayed by the first pixel of a plurality of pixels disposed around the first pixel as the second pixel.

3. The display device according to claim 1, wherein when the image displayed on the display panel is a moving image, the display control circuit is configured to determine the second pixel of a plurality of pixels disposed around the first pixel based on a movement vector of the moving image.

4. The display device according to claim 1, wherein the display control circuit is configured to determine the second pixel of a plurality of pixels disposed around the first pixel based on a movement direction of a device mounted on the display device.

5. The display device according to claim 1, wherein the third pixel is disposed in a direction of the first pixel with respect to the second pixel.

6. The display device according to claim 1, wherein a color displayed by the first pixel is different from colors displayed by the pixels disposed around the first pixel.

7. The display device according to claim 1, wherein an amount that decreases the luminance of the first pixel varies depending on a definition of the display panel.

8. The display device according to claim 1, wherein the display control circuit is configured to reduce an amount that increases the luminance of the second pixel when the second pixel is the protection target pixel.

9. The display device according to claim 1, wherein the display control circuit is configured to change the second pixel when the second pixel is the protection target pixel.

10. A display device comprising:
a display panel on which a plurality of pixels having a light emitting element is disposed; and
a display control circuit configured to display an image on the display panel by causing each of the plurality of pixels to emit light based on a pixel signal that defines luminance of each of the plurality of pixels,
wherein the display control circuit is configured to display the image by decreasing luminance of a first pixel which is a protection target pixel of the plurality of pixels and increasing luminance of a second pixel disposed around the first pixel,
wherein when a plurality of first pixels, which are the protection target pixels, are disposed consecutively, the display control circuit is configured to display the image by decreasing luminance of a part of the plurality of first pixels and increasing luminance of the second pixel disposed around a part of the plurality of first pixels, and
a part of the plurality of first pixels decreasing the luminance is changed for each image displayed on the display panel.

11. A display method executed by a display device comprising a display panel on which a plurality of pixels having a light emitting element is disposed, and a display control circuit configured to display an image on the display panel by causing each of the plurality of pixels to emit light based on a pixel signal that defines luminance of each of the plurality of pixels, the display method comprising:
determining whether or not a first pixel of the plurality of pixels is a protection target pixel; and
displaying the image by decreasing luminance of the first pixel which is the protection target pixel of the plurality of the pixels and increasing luminance of a second pixel disposed around the first pixel when the first pixel is determined to be a protection target pixel
wherein each of the plurality of pixels comprises first to third sub-pixels having a light emitting element having a different light emission color,
the displaying comprises decreasing luminance of a first sub-pixel included in the first pixel and increasing luminance of the first sub-pixel included in the second pixel is increased, when the pixel, which is the protection target, is the first sub-pixel included in the first pixel, and
when a sub-pixel, which is the protection target, is a second sub-pixel included in the first pixel, the displaying comprises decreasing luminance of the first pixel, increasing luminance of the second pixel, decreasing luminance of the first and third sub-pixels included in the second pixel, and increasing luminance of the first and third sub-pixels included in a third pixel disposed around the second pixel.

12. The display method according to claim 11, wherein when the image displayed on the display panel is a still image, the displaying comprises determining a pixel that displays a color similar to a color displayed by the first pixel of a plurality of pixels disposed around the first pixel as the second pixel.

13. The display method according to claim 11, wherein when the image displayed on the display panel is a moving image, the displaying comprises determining the second pixel of a plurality of pixels disposed around the first pixel based on a movement vector of the moving image.

14. The display method according to claim 11, wherein the displaying comprises determining the second pixel of a plurality of pixels disposed around the first pixel based on a movement direction of a device mounted on the display device.

15. The display method according to claim 11, wherein the third pixel is disposed in a direction of the first pixel with respect to the second pixel.

16. The display method according to claim 11, wherein a color displayed by the first pixel is different from colors displayed by the pixels disposed around the first pixel.

17. The display method according to claim 11, wherein an amount that decreases the luminance of the first pixel varies depending on a definition of the display panel.

18. The display method according to claim 11, wherein when the second pixel is the protection target pixel, the displaying comprises reducing an amount that increases the luminance of the second pixel.

19. The display method according to claim 11, wherein when the second pixel is the protection target pixel, the displaying comprises changing the second pixel.

20. A display method executed by a display device comprising a display panel on which a plurality of pixels having a light emitting element is disposed, and a display control circuit configured to display an image on the display panel by causing each of the plurality of pixels to emit light based on a pixel signal that defines luminance of each of the plurality of pixels, the method comprising:
determining whether or not a first pixel of the plurality of pixels is a protection target pixel; and
displaying the image by decreasing luminance of the first pixel which is the protection target pixel of the plurality of the pixels and increasing luminance of a second pixel disposed around the first pixel when the first pixel is determined to be a protection target pixel,
wherein when a plurality of first pixels, which are the protection target pixels, are disposed consecutively, the displaying comprises displaying the image by decreasing luminance of a part of the plurality of first pixels and increasing luminance of the second pixel disposed around a part of the plurality of first pixels, and
a part of the plurality of first pixels decreasing the luminance is changed for each image displayed on the display panel.

* * * * *